(12) United States Patent
Zhang et al.

(10) Patent No.: US 7,368,791 B2
(45) Date of Patent: May 6, 2008

(54) MULTI-GATE CARBON NANO-TUBE TRANSISTORS

(75) Inventors: Yuegang Zhang, Cupertino, CA (US); Brian S. Doyle, Portland, OR (US); George I. Bourianoff, Austin, TX (US)

(73) Assignee: Intel Corporation, Santa Clara, CA (US)

(*) Notice: Subject to any disclaimer, the term of this patent is extended or adjusted under 35 U.S.C. 154(b) by 210 days.

(21) Appl. No.: 11/215,559

(22) Filed: Aug. 29, 2005

(65) Prior Publication Data
US 2007/0281409 A1   Dec. 6, 2007

Related U.S. Application Data

(60) Division of application No. 10/402,780, filed on Mar. 28, 2003, now Pat. No. 6,972,467, which is a continuation-in-part of application No. 10/227,068, filed on Aug. 23, 2002.

(51) Int. Cl.
H01L 29/76 (2006.01)
H01L 29/94 (2006.01)

(52) U.S. Cl. .................. 257/401; 977/742; 977/842

(58) Field of Classification Search ............ 977/742, 977/842; 438/82, 99; 257/401, 419
See application file for complete search history.

(56) References Cited

U.S. PATENT DOCUMENTS

| | | | |
|---|---|---|---|
| 4,906,589 A | 3/1990 | Chao | |
| 5,124,777 A | 6/1992 | Lee et al. | |
| 5,338,959 A | 8/1994 | Kim et al. | |
| 5,346,839 A | 9/1994 | Sundaresan | |
| 5,466,621 A | 11/1995 | Hisamoto et al. | |
| 5,545,586 A | 8/1996 | Koh | |
| 5,563,077 A | 10/1996 | Ha et al. | |
| 5,578,513 A | 11/1996 | Maegawa | |
| 5,658,806 A | 8/1997 | Lin et al. | |
| 5,701,016 A | 12/1997 | Burroughs et al. | |
| 5,716,879 A | 2/1998 | Choi et al. | |
| 5,793,088 A | 8/1998 | Choi et al. | |
| 5,827,769 A | 10/1998 | Aminzadeh et al. | |

(Continued)

FOREIGN PATENT DOCUMENTS

EP    0 623963 A1   11/1994

(Continued)

OTHER PUBLICATIONS

International Search Report PCT/US03/26242, mailed Jan. 26, 2004 (8 pgs.).

(Continued)

*Primary Examiner*—Theresa T Doan
(74) *Attorney, Agent, or Firm*—Rahul D. Engineer

(57) ABSTRACT

According to one aspect of the invention, a semiconducting transistor is described. The channel portion of the transistor includes carbon nanotubes formed on top of an insulating layer which covers a local bottom gate. Source and drain conductors are located at ends of the carbon nanotubes. A gate dielectric surrounds a portion of the carbon nanotubes with a substantially uniform thickness. A local top gate is located between the source and drain conductors over the carbon nanotubes. Lower portions of the local top gate are positioned between the carbon nanotubes as the local top gate forms pi-gates or "wraparound" gates around each carbon nanotube.

5 Claims, 13 Drawing Sheets

U.S. PATENT DOCUMENTS

| | | |
|---|---|---|
| 5,888,309 A | 3/1999 | Yu |
| 5,905,285 A | 5/1999 | Gardner et al. |
| 6,163,053 A | 12/2000 | Kawashima |
| 6,252,284 B1 | 6/2001 | Muller et al. |
| 6,307,235 B1 | 10/2001 | Forbes et al. |
| 6,376,317 B1 | 4/2002 | Forbes et al. |
| 6,383,882 B1 | 5/2002 | Lee et al. |
| 6,396,108 B1 | 5/2002 | Krivokapic et al. |
| 6,407,442 B2 | 6/2002 | Inoue et al. |
| 6,413,802 B1 | 7/2002 | Hu et al. |
| 6,413,877 B1 | 7/2002 | Annapragada |
| 6,475,869 B1 | 11/2002 | Yu |
| 6,475,890 B1 | 11/2002 | Yu |
| 6,483,156 B1 | 11/2002 | Adkisson et al. |
| 6,515,339 B2 * | 2/2003 | Shin et al. .................. 257/368 |
| 6,525,403 B2 | 2/2003 | Inaba et al. |
| 6,562,665 B1 | 5/2003 | Yu |
| 6,611,029 B1 | 8/2003 | Ahmed et al. |
| 6,635,909 B2 | 10/2003 | Clark et al. |
| 6,645,797 B1 | 11/2003 | Buynoski et al. |
| 6,680,240 B1 | 1/2004 | Maszara |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,690 B1 | 4/2004 | Wang et al. |
| 6,730,964 B2 | 5/2004 | Horiuchi |
| 6,756,657 B1 | 6/2004 | Zhang et al. |
| 6,764,884 B1 | 7/2004 | Yu et al. |
| 6,790,733 B1 | 9/2004 | Natzle et al. |
| 6,794,313 B1 | 9/2004 | Chang |
| 6,835,618 B1 | 12/2004 | Dakshina-Murthy et al. |
| 6,858,478 B2 | 2/2005 | Chau et al. |
| 6,884,154 B2 | 4/2005 | Mizushima et al. |
| 6,921,982 B2 | 7/2005 | Joshi et al. |
| 2002/0011612 A1 | 1/2002 | Hieda |
| 2002/0036290 A1 | 3/2002 | Inaba et al. |
| 2002/0081794 A1 | 6/2002 | Ito |
| 2002/0166838 A1 | 11/2002 | Nagarajan |
| 2002/0167007 A1 | 11/2002 | Yamazaki et al. |
| 2003/0057486 A1 | 3/2003 | Gambino et al. |
| 2003/0085194 A1 | 5/2003 | Hopkins, Jr. |
| 2003/0098488 A1 * | 5/2003 | O'Keeffe et al. ............ 257/401 |
| 2003/0102497 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0186167 A1 * | 10/2003 | Johnson, Jr. et al. ........ 430/296 |
| 2003/0201458 A1 | 10/2003 | Clark et al. |
| 2003/0227036 A1 | 12/2003 | Sugiyama et al. |
| 2004/0031979 A1 | 2/2004 | Lochtefeld et al. |
| 2004/0036118 A1 | 2/2004 | Adadeer et al. |
| 2004/0036127 A1 | 2/2004 | Chau et al. |
| 2004/0070020 A1 | 4/2004 | Fujiwara et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0110097 A1 | 6/2004 | Ahmed et al. |
| 2004/0119100 A1 | 6/2004 | Nowak et al. |
| 2004/0126975 A1 | 7/2004 | Ahmed et al. |
| 2004/0166642 A1 | 8/2004 | Chen et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0219780 A1 | 11/2004 | Ohuchi |
| 2004/0227187 A1 | 11/2004 | Cheng et al. |
| 2004/0238887 A1 | 12/2004 | Nihey |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0035415 A1 | 2/2005 | Yeo et al. |
| 2005/0118790 A1 | 6/2005 | Lee et al. |
| 2005/0127362 A1 | 6/2005 | Zhang et al. |
| 2005/0145941 A1 | 7/2005 | Bedell et al. |
| 2005/0156171 A1 | 7/2005 | Brask et al. |
| 2005/0224797 A1 | 10/2005 | Ko et al. |
| 2005/0224800 A1 | 10/2005 | Lindert |

FOREIGN PATENT DOCUMENTS

| | | |
|---|---|---|
| EP | 1 202 335 A2 | 5/2002 |
| EP | 1 566 844 A2 | 8/2005 |
| JP | 06177089 | 6/1994 |
| JP | 2003-298051 | 10/2003 |
| WO | WO 02/43151 A1 | 5/2002 |
| WO | WO 2004/059726 A1 | 7/2004 |

OTHER PUBLICATIONS

International Search Report PCT/US03/39727, mailed Apr. 27, 2004 (6 pgs.).

International Search Report PCT/US03/40320, mailed Jun. 2, 2004 (6 pgs.).

International Search Report PCT/US2005/000947, mailed May 3, 2005 (7 pgs.).

International Search Report PCT/US2005/010505, mailed Aug. 26, 2005 (24 pgs.).

International Search Report PCT/US2005/020339, mailed Oct. 4, 2005 (9 pgs.).

International Search Report PCT/US2005/033439, mailed Jan. 31, 2006 (7 pgs.).

International Search Report PCT/US2005/035380, mailed Feb. 13, 2006 (14 pgs.).

International Search Report PCT/US2005/037169, mailed Feb. 23, 2006 (11 pgs.).

Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.

Jing Guo et al. "Performance Projections for Ballistic Carbon Nanotube Field-Effect Transistors" Applied Physics Letters, vol. 80, No. 17, Apr. 29, 2002, pp. 3192-2194.

Ali Javey et al., "High-K Dielectrics for Advanced Carbon-Nanotube Transistors and Logic Gates", Advance Online Publication, Published online, Nov. 17, 2002, pp. 1-6.

Richard Martel et al., "Carbon Nanotube Field Effect Transistors for Logic Applications" IBM, T.J. Watson Research Center, 2001 IEEE, IEDM 01, pp. 159-162.

David M. Fried et al., "Improved Independent Gate N-Type FinFET Fabrication and Characterization", IEEE Electron Device Letters, vol. 24, No. 9, Sep. 2003, pp. 592-594.

David M. Fried et al., "Improved Independent Gate P-Type Independent-Gate FinFETs", IEEE Electron Device Letters, vol. 25, No. 4, Apr. 2004, pp. 199-201.

Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

Charles Kuo et al., "A Capacitorless Double-Gate DRAM Cell Design for High Density Applications", 2002 IEEE International Electron Devices Meeting Technical Digest, Dec. 2002, pp. 843-846.

Takashi Ohsawa et al., "Memory Design Using a One-Transistor Gain Cell on SOI", IEEE Journal of Solid-State Circuits, vol. 37, No. 11, Nov. 2002, pp. 1510-1522.

T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).

V. Subramanian et al. "A Bulk Si-Compatible Ultrathin-Body SOI Technology for Sub-100nm MOSFETS", Proceedings of the 57th Annual Device Reach Conference, (1999) pp. 28-29.

Hisamoto et al. "A Folded-Channel MOSFET for Deep-sub-tenth Micron Era", 1998 IEEE International Electron Device Meeting Technical Digest, (1998) pp. 1032-1034.

Huang et al., "Sub 50nm FinFet: PMOS", 1999 IEEE International Electron Device Meeting Technical Digets, (1999) pp. 67-70.

Auth et al., "Vertical, Fully-Depleted, Surroundings Gate MOSFETS on Sub 0.1um Thick Silicon Pillars", 1996 54th Annual Device Reseach Conference Digest, (1996) pp. 108-109.

Hisamoto et al., "A Fully Depleted Lean-Channel Transistor (DELTA)—A Novel Vertical Ultrathin SOI MOSFET", IEEE Electron Device Letters, vol. 11 No. 1, (1990) pp. 36-38.

Jong-Tae Park et al., "Pi-Gate SOI MOSFET" IEEE Electron Device Letters, vol. 22, No. 8, Aug. 2001, pp. 405-406.

Digh Hisamoto et al., "FinFet—A Self Aligned Double-Gate MOSFET Scalable to 20nm", IEEE Transactions on Electron Devices, vol. 47, No. 12, Dec. 2000, pp. 2320-2325.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Triple Gate FinFets", IEEE 2003, pp. 135-138.

S. T. Chang et al., "3-D Simulation of Strained Si/SiGe Heterojunction FinFETs", pp. 176-177.

B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

Guo, Jing et al., Performance projections for ballistic carbon nanotube field-effect transistors, *Applied Physics Letters*, vol. 80, No. 17, Apr. 29, 2002, 3192-3194.

Javey, Ali et al., High-κ dielectrics for advanced carbon-nanotube transistors and logic gates, *Advance Online Publication*, Nov. 17, 2002, pp. 1-6.

Martel, Richard et al., Carbon Nanotube Field Effect Transistors for Logic Applications, IBM *T.J. Watson Research Center*, 2001 IEEE, IEDM 01-159-162, 4 pp..

\* cited by examiner

MULTI-GATE CARBON NANO-TUBE TRANSISTORS

CROSS-REFERENCE TO RELATED APPLICATIONS

This is a Divisional Application of Ser. No. 10/402,780 filed Mar. 28, 2003, now U.S. Pat. No. 6,972,467 which is presently.

This is a continuation-in-part of prior U.S. patent application Ser. No. 10/227,068, filed on Aug. 23, 2002.

BACKGROUND

1). Field of the Invention

Embodiments of the present invention relate to the field of semiconductor integrated circuits, and more particularly to a multi-gate carbon nanotube transistor.

2). Discussion of Related Art

Integrated circuits used in modern computers are formed on semiconductor wafers. The wafers are then sawed into semiconductor chips also known as microelectronic dies. Semiconductor chips include literally millions of semiconductor transistors formed on top of what was once the semiconductor wafer.

Each transistor includes a source conductor, a drain conductor, at least one gate electrode, and a semiconducting channel. The semiconducting channel will conduct electricity only when it is placed in an electric field. A voltage is constantly applied across the source and drain conductors which are separated by the channel which normally will not conduct electricity, so that the transistor is off. Current will only conduct from the source to the drain if a threshold voltage is applied to the gate electrode to create an electric field strong enough to cause the channel to conduct electricity to switch the transistor on.

The use of carbon nanotubes as channels in transistors has been studied in recent years. However, the nanotubes have not performed considerably better than traditional semiconducting channels when they are used with conventional gate structures.

BRIEF DESCRIPTION OF THE DRAWINGS

An embodiment of the invention is described by way of examples with reference to the accompanying drawings, wherein.

DETAILED DESCRIPTION

FIG. 1 to FIG. 15 of the accompanying drawings illustrate two embodiments of a semiconductor transistor. The channel portion of the transistor includes carbon nanotubes formed on top of an insulator, insulating layer, or gate dielectric which covers a local bottom gate. Source and drain conductors are located at ends of the carbon nanotubes. Another insulator surrounds a portion of the carbon nanotubes with a substantially uniform thickness. A local top gate is located between the source and drain conductors over the carbon nanotubes. Lower portions of the local top gate are positioned between the carbon nanotubes as the local top gate forms pi-gates or "wraparound" gates around each carbon nanotube.

Figure 1:
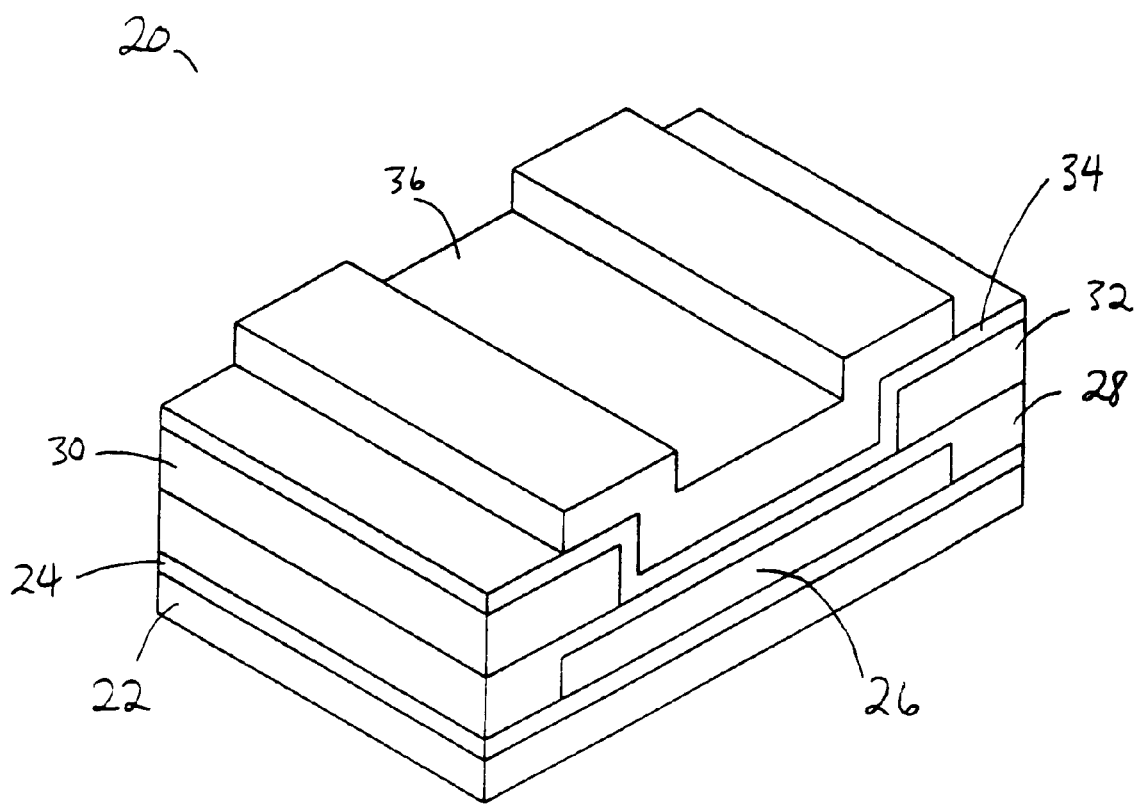
FIG. 1 is a perspective view of a multi-carbon nanotube double gate transistor.

FIG. 1 illustrates a multi-carbon nanotube double gate transistor 20. The multi-carbon nanotube double gate transistor 20 includes a silicon substrate 22, a first insulating layer 24, a local bottom gate 26, a second insulating layer 28, a source conductor 30, a drain conductor 32, a third insulating layer 34, and a local top gate 36.

Figure 2:
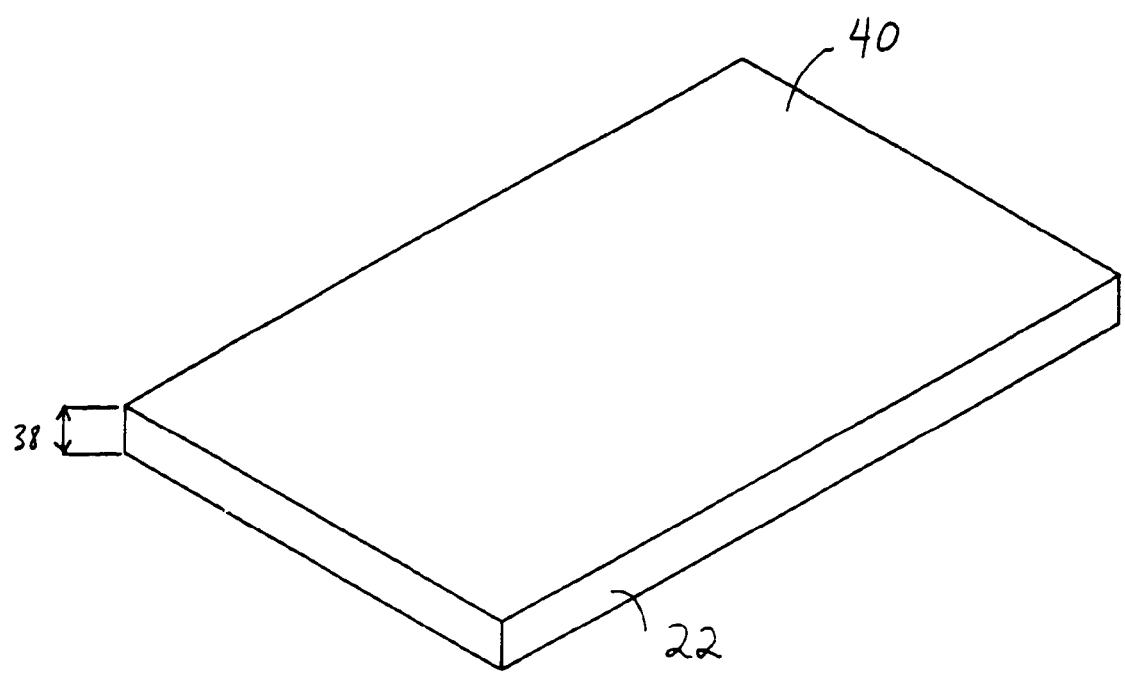
FIG. 2 is a perspective view of a silicon substrate.

FIG. 2 illustrates the silicon substrate 22. The silicon substrate 22 is made of monocrystalline silicon has a thickness 38 of 75 microns and an upper surface 40.

Figure 3:
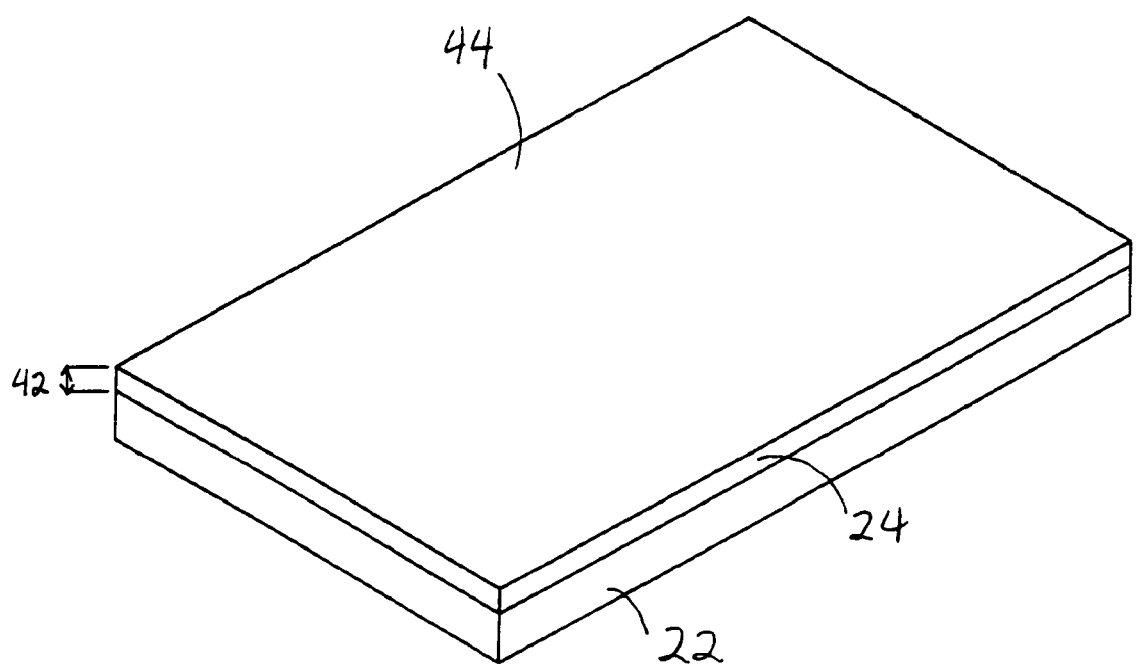
FIG. 3 is a perspective view of the silicon substrate with a first insulating layer formed thereon.

FIG. 3 illustrates the substrate 22 with the first insulating layer 24, or gate dielectric thereon. The first insulating layer 24 is made of silicon oxide has a thickness 42 of 100 nanometers and an upper surface 44. The first insulating layer 24 is formed on the upper surface 40 of the silicon substrate 22 by chemical vapor deposition (CVD).

Figure 4:
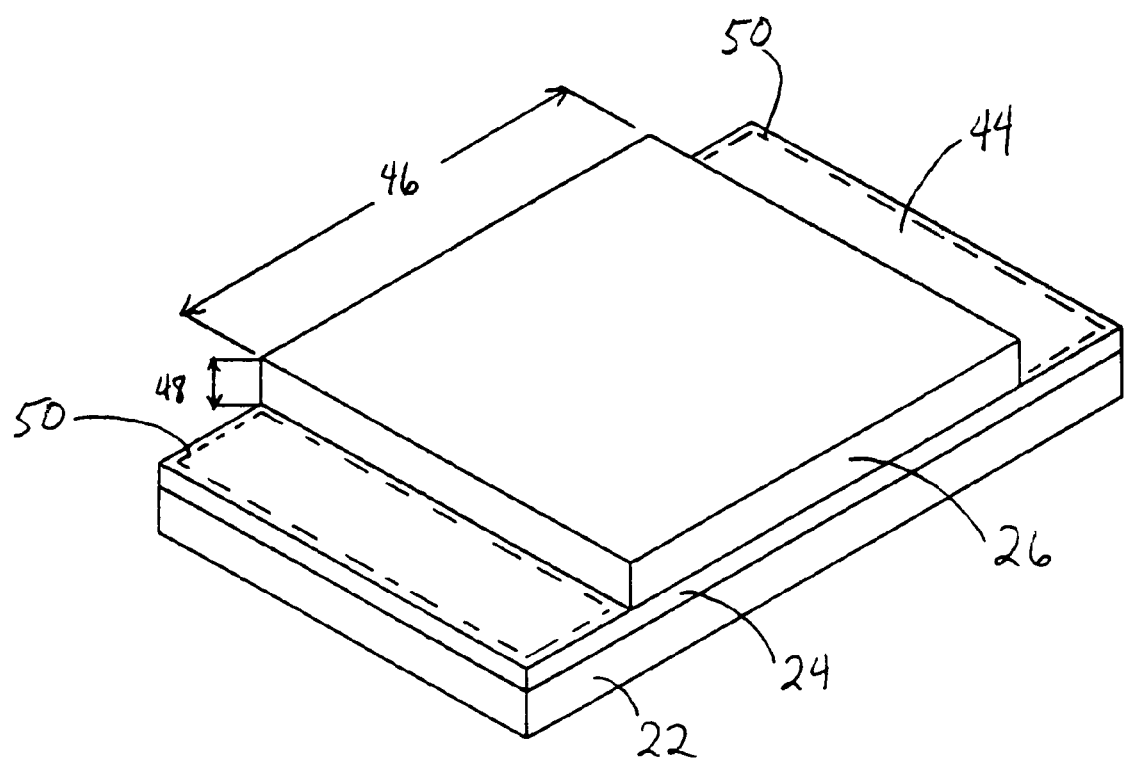
FIG. 4 is a perspective view of the silicon substrate with a local bottom gate formed on top of the first insulating layer.

FIG. 4 illustrates the substrate 22 with the local bottom gate 26, or gate electrode, formed on top of the first insulating layer 24. The local bottom gate 26 has a length 46 of 1000 nanometers and a thickness 48 of 250 nanometers and is made of tungsten. The local bottom gate 26 is formed by CVD on a central region of the upper surface 44 of the first insulating layer 24 leaving exposed portions 50 of the upper surface 44 of the first insluting layer 24.

Figure 5:
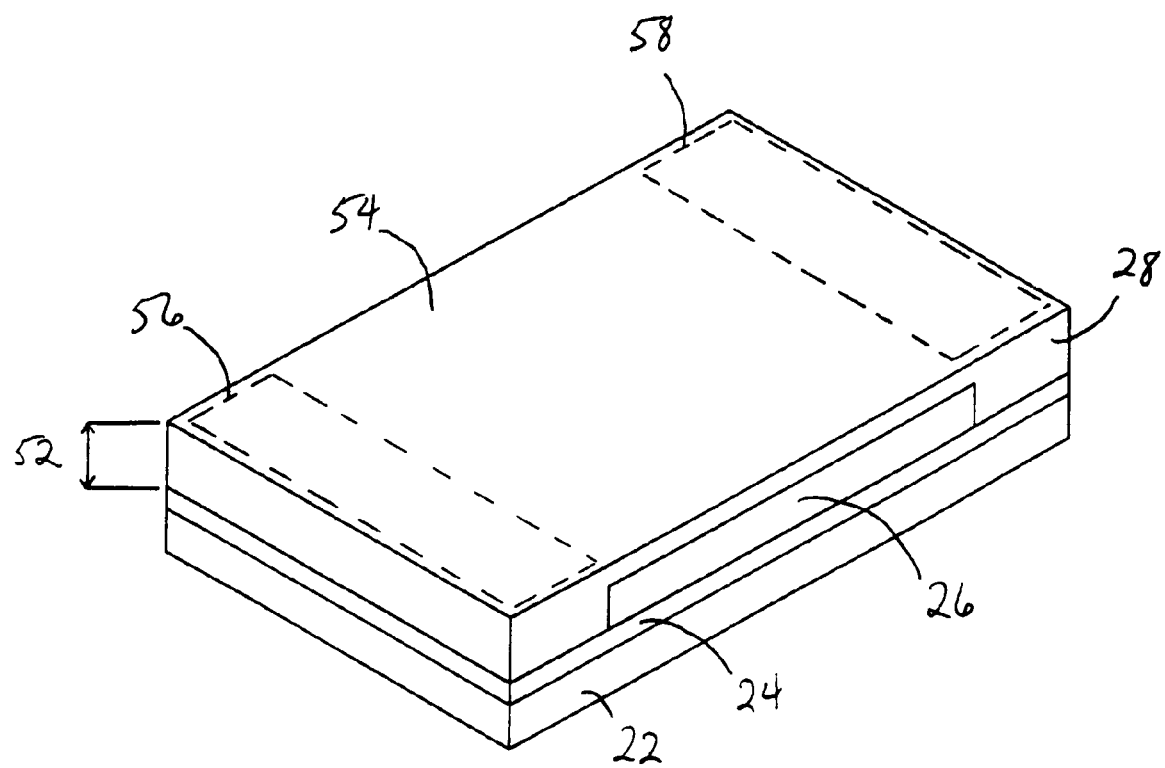
FIG. 5 is a perspective view of the silicon substrate with a second insulating layer formed over the local bottom gate and the first insulating layer.

FIG. 5 illustrates the substrate 22 with the second insulating layer 28, or gate dielectric, over and adjacent to the local bottom gate 26. The second insulating layer 28 is made of zirconium oxide and has a maximum thickness 52 of 300 nanometers over the exposed portions 50 of the upper surface 44 of the first insulating layer 24. The second insulating layer 28 has an upper surface 54 with a source portion 56 and a drain portion 58. The source portion 56 and the drain portion 58 are at laterally opposing sides of the local bottom gate 26.

Figure 6:
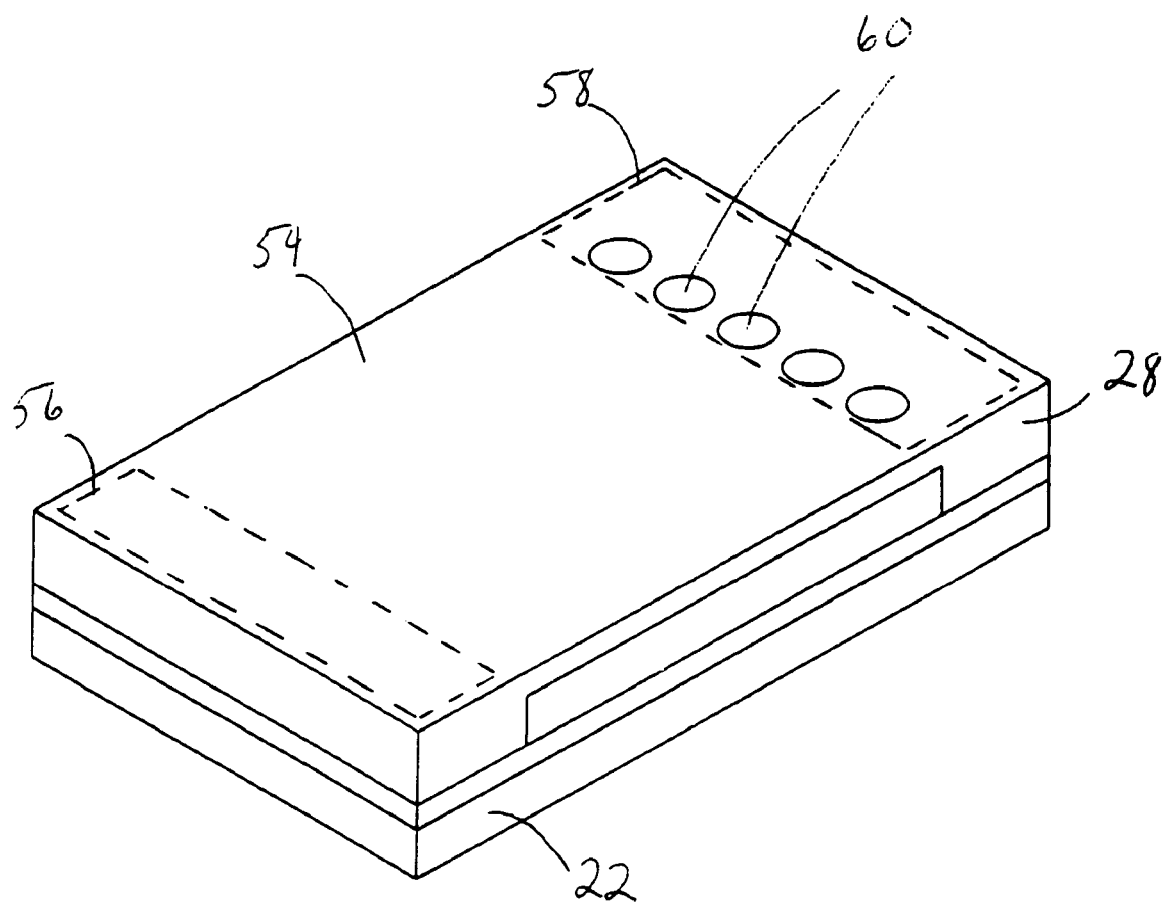
FIG. 6 is a perspective view of the substrate with iron catalysts having been formed on the second insulating layer.

FIG. 6 illustrates the substrate 22 with iron catalysts 60 deposited on the second insulating layer 28. The iron catalysts 60 are located on the drain potion 58 of the upper surface 54 of the second insulating layer 28. The catalysts 60 are deposited over a layer of photoresist having small holes in it, which is temporarily formed on the second insulating layer 28. The catalysts 60 settle into the holes and remain on the second insulating layer 28 when the photoresist layer is removed. Each catalyst consists of a single nanoparticle of iron.

Figure 7:
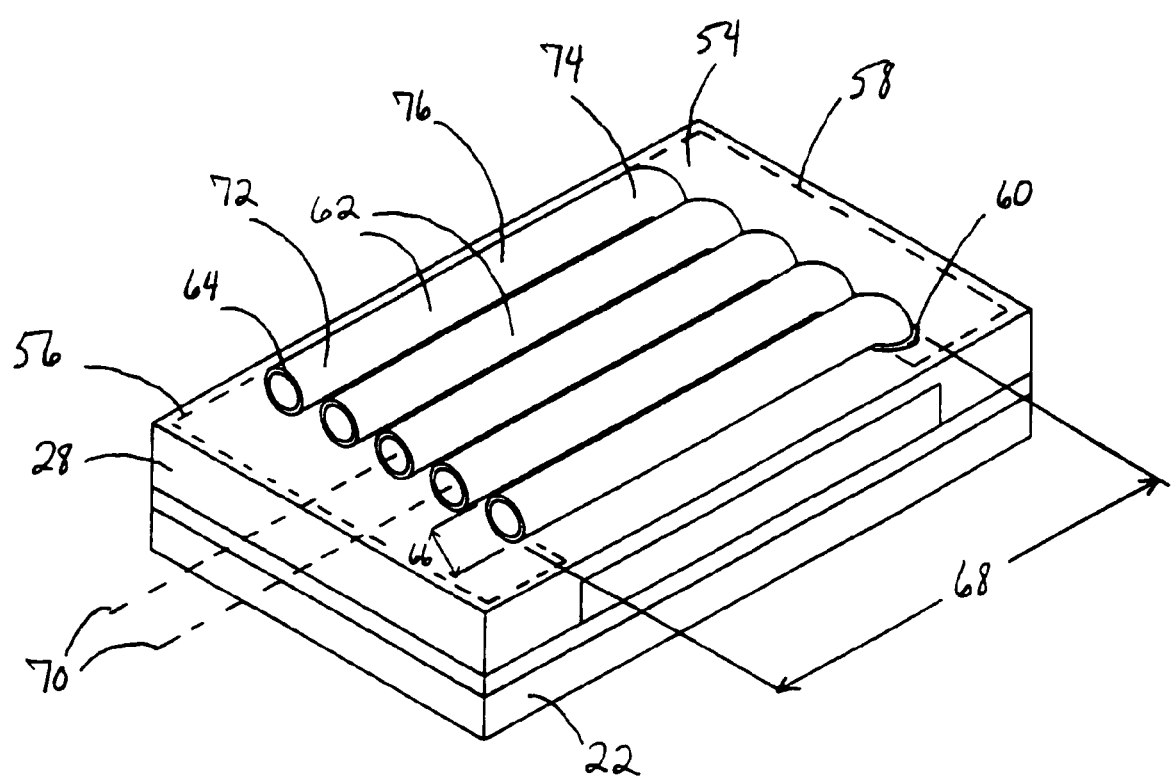
FIG. 7 is a perspective view of the silicon substrate with carbon nanotubes having been grown from the iron catalysts.

FIG. 7 illustrates the substrate 22 with single walled semiconducting carbon nanotubes 62 grown on the upper surface 54 of the second insulating layer 28. The carbon nanotubes 62 are cylindrical with curved outer surfaces 64 having diameters 66 of between 1 and 2 nanometers, lengths 68 between 500 and 1,000 nanometers, and have primary elongate axes 70. Each carbon nanotube 62 include a source end 72, a drain end 74, and a channel portion 76 which is between the source end 72 and the drain end 74. The carbon nanotubes 62 are grown from and chemically bonded to the iron catalysts 60 by CVD. The carbon nanotubes 62 extend from the drain portion 58 of the upper surface 54 of the second insulating layer 28 to the source portion 56. The elongate axes 70 are parallel to each other and the upper surface 40 of the substrate 22. The parallel orientation can be achieved by applying an electric field during the growing process.

Figure 8:
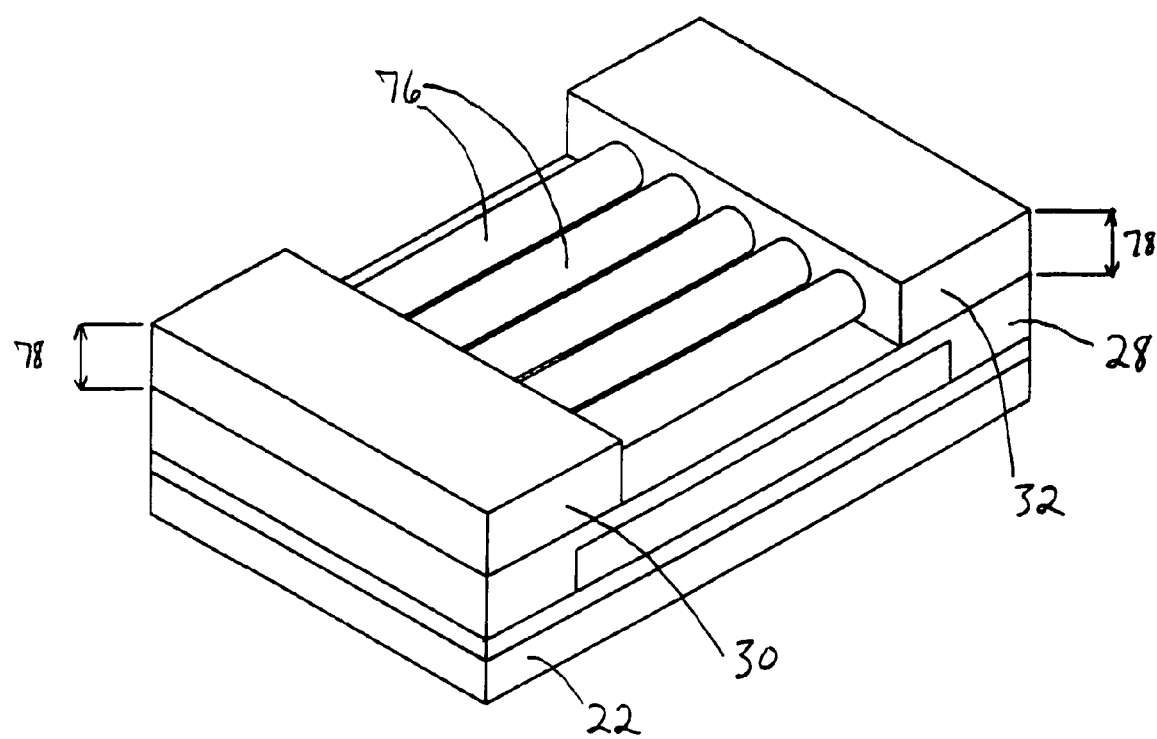
FIG. 8 is a perspective view of the substrate with source and drain conductors having been formed at the ends of the carbon nanotubes.

FIG. 8 illustrates the substrate 22 with the source 30 and drain 32 conductors formed on the second insulating layer 28. The source 30 and drain 32 conductors have thicknesses 78 of 300 nanometers, are made of a mixture of titanium and aluminum, and have a distance between them of 800 nanometers. The source 30 and drain 32 conductors are formed by CVD. The source conductor 30 is on the source portion 56 of the upper surface 54 of the second insulating layer 28 and over the source ends 72 of the carbon nanotubes 62. The drain conductor 32 is on the drain portion 58 of the upper surface 54 of the second insulating layer 28 and over the drain ends 74 of the carbon nanotubes 62. The channel portions 76 of the carbon nanotubes 62 are not covered by the source 30 and drain 32 conductors.

Figure 9:
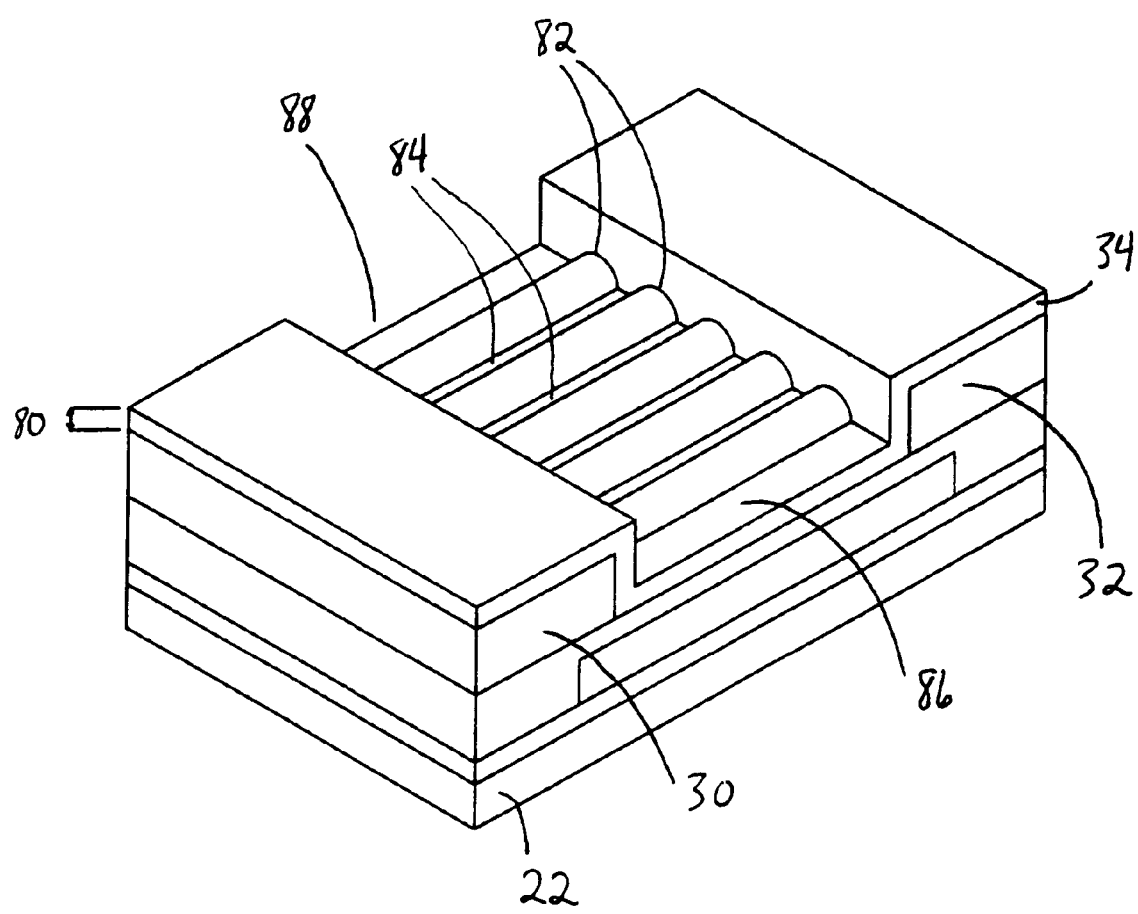
FIG. 9 is a perspective view of the substrate with a third insulating layer having been formed over the source and drain conductors and the carbon nanotubes.

FIG. 9 illustrates the substrate 22 with the third insulating layer 34, or gate dielectric, formed over the source 30 and drain 32 conductors. The third insulating layer 34 is formed by CVD over the source 30 and drain conductors 32 and channel portions 76 of the carbon nanotubes 62. The third insulating layer 34 is made of zirconium oxide and has a substantially uniform thickness 80 of 1-5 nanometers. The third insulating layer 34 has conformed to the curved outer surfaces 64 of the carbon nanotubes 62 and now has curved portions 82 and depressions 84 between the curved the portions 82 over the channel portions 76 of the carbon nanotubes 62. The third insulating layer 34 has an upper surface 86 and a trench 88 that extends between the source 30 and drain 32 conductors over the channel portions 76 of the carbon nanotubes 62.

Figure 10:
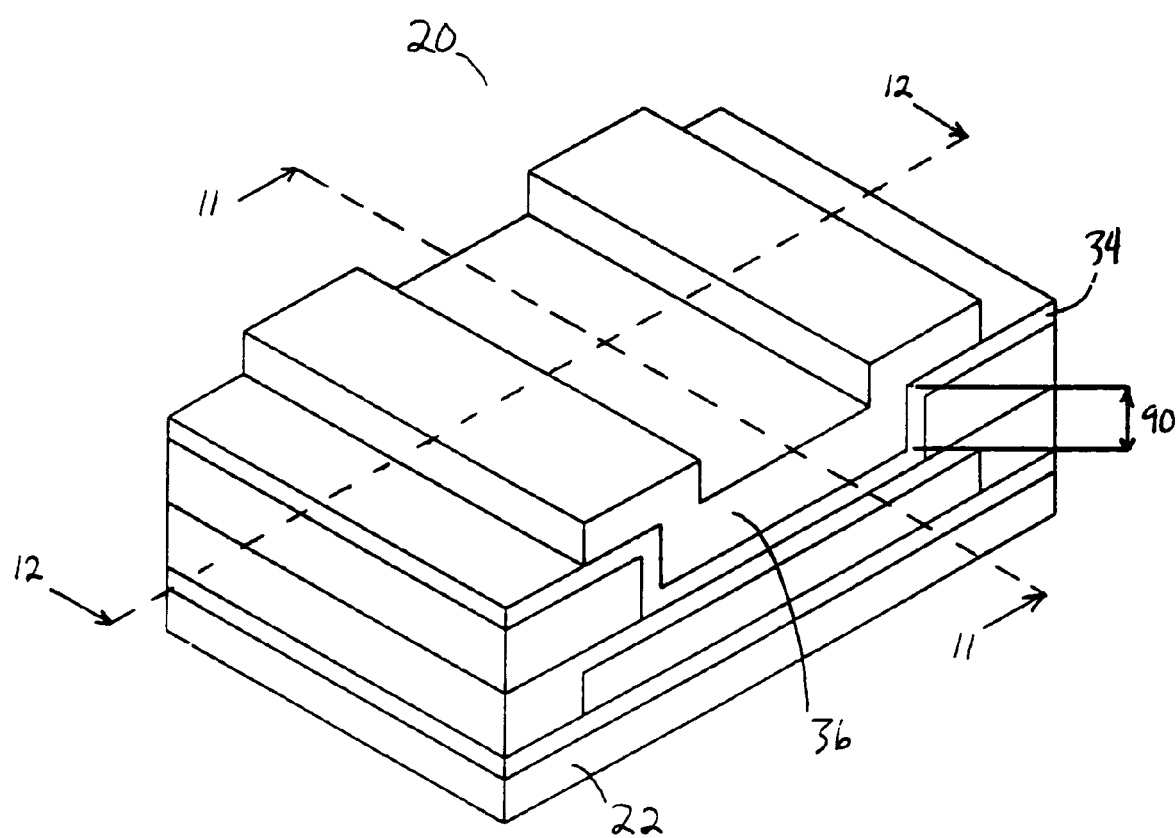
FIG. 10 is a perspective view of the multi-carbon nanotube double gate transistor.

FIG. 10 illustrates the substrate 22 with the local top gate 36, or gate electrode, formed on the third insulating layer 34. The local top gate 36 is made of aluminum and has a thickness 90 of 300 nanometers. The local top gate 36 has been formed by CVD into the trench 88 of the upper surface 86 of the third insulating layer 34, over the channel portions 76 and source 72 and drain 74 ends of the carbon nanotubes 62, partially over the source 30 and drain 32 conductors, and adjacent to the third insulating layer 34 to complete the multi-carbon nanotube double gate transistor 20.

Figure 11:
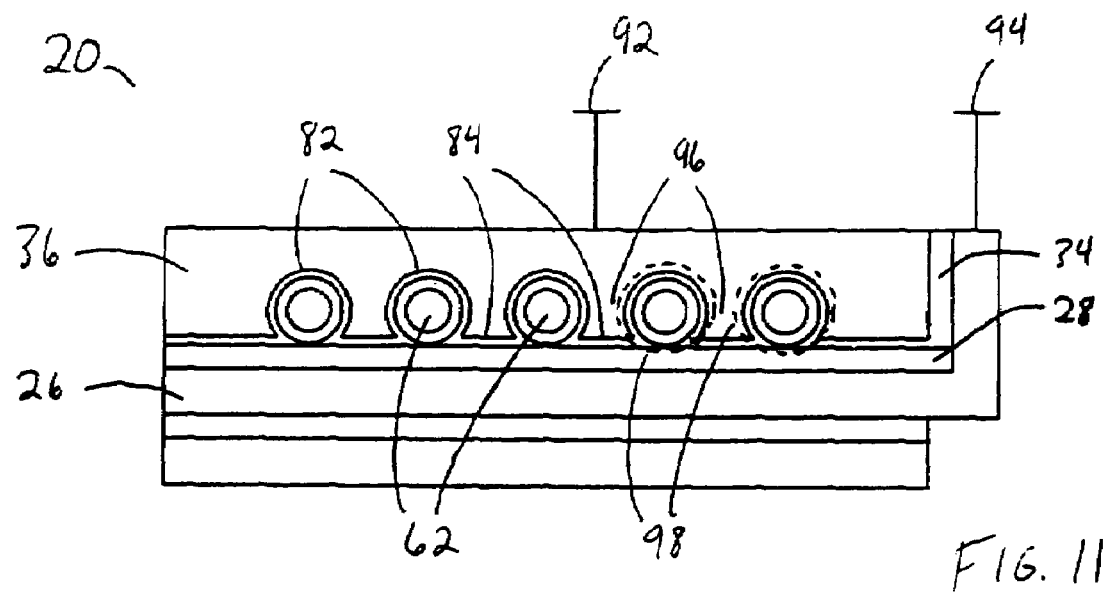
FIG. 11 is a cross sectional side view on 11-11 in FIG. 10 of the multi-carbon nanotube double gate transistor.

FIG. 11 illustrates the multi-carbon nanotube double gate transistor 20. The local top gate 36 has been connected to a first electric terminal 92 and the local bottom gate 26 has been connected to a separate second electric terminal 94.

The local top gate 36 and the local bottom gate 26 are separated by the second and third insulating layers 28 and 34. The local top gate 36 has formed to match the curved portions 82 and depressions 84 of the upper surface 86 of the third insulating layer 34. Lower portions 96 of the local top gate 36 extend downward between the carbon nanotubes 62. The third insulating layer 34 and the local top gate 36 are at a uniform distance to each of the carbon nanotubes 62. The local top gate 36 has formed multi-angle pi-gates 98, or "wraparound" gates, around each of the carbon nanotubes 62. Each pi-gate 98 wraps around approximately 75 percent its respective carbon nanotube 62.

Figure 12:
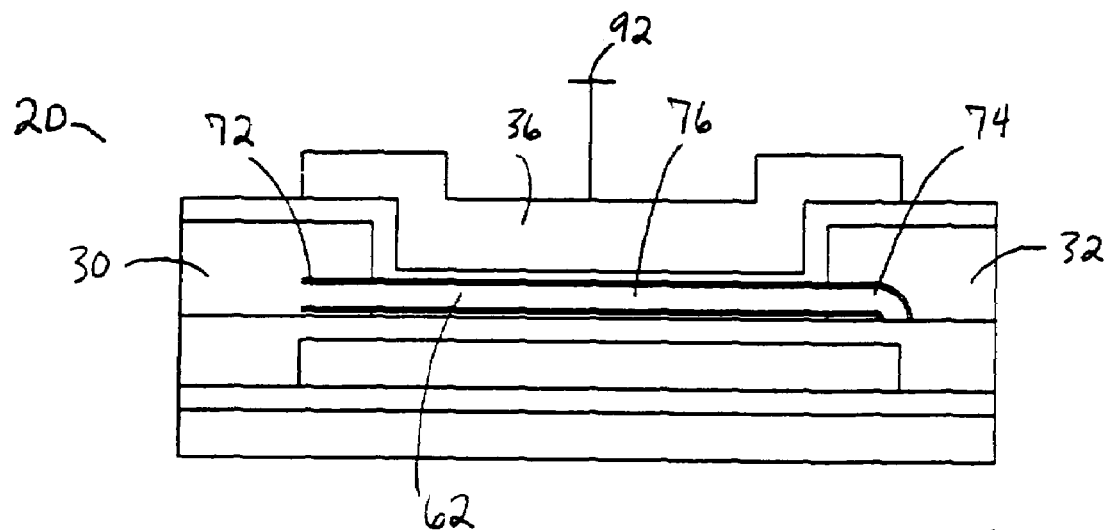
FIG. 12 is a cross sectional side view on 12-12 in FIG. 10 of the multi-carbon nanotube double gate transistor.

FIG. 12 illustrates the multi-carbon nanotube double gate transistor 20. The carbon nanotubes 62 interconnect the source 30 and drain 32 conductors. The source 30 and drain 32 conductors have been formed over the respective source 72 and drain 74 ends of the carbon nanotubes 62. The local top gate 36 is positioned over the channel portions 76 and source 72 and drain 74 ends of the carbon nanotubes 62. The local bottom gate 26 is positioned beneath the local top gate 36 beneath the channel portions 76 of the carbon nanotubes 62.

Is use, a primary voltage is applied across the source 30 and drain 32 conductors at all times. The insulating layers separate the source 30 and drain 32 conductors from the local top 36 and bottom 26 gates. Thus, no current conducts through the carbon nanotubes 62 from the source 30 to the drain 32 conductor if no voltage is applied to the local top 36 and bottom gates 26, and the transistor is "off" because no current conducts from the source conductor 30 to the drain conductor 32 since the carbon nanotubes 62 are not conductive.

When a voltage is applied to the local top 36 and bottom 26 gates, the carbon nanotubes 62 act as conductors and a "channel" of the transistor due to the semiconducting properties of the carbon nanotubes 62. Thus, the transistor is "on" because current conducts from the source conductor 30 through the channel to the drain conductor 32 as the source 30 and drain 32 conductors are electrically coupled. The pi-gates 98 formed by the local top gate 36 act as multi-gates around each of the carbon nanotubes 62.

One advantage is that the use of multiple gates increases gate capacitance. The use of the pi-gates around each of the carbon nanotube channels even further increases gate capacitance while utilizing conventional planar fabrication tools. Another advantage is that electron transport and electron mobility through the channel are improved.

Figure 13:
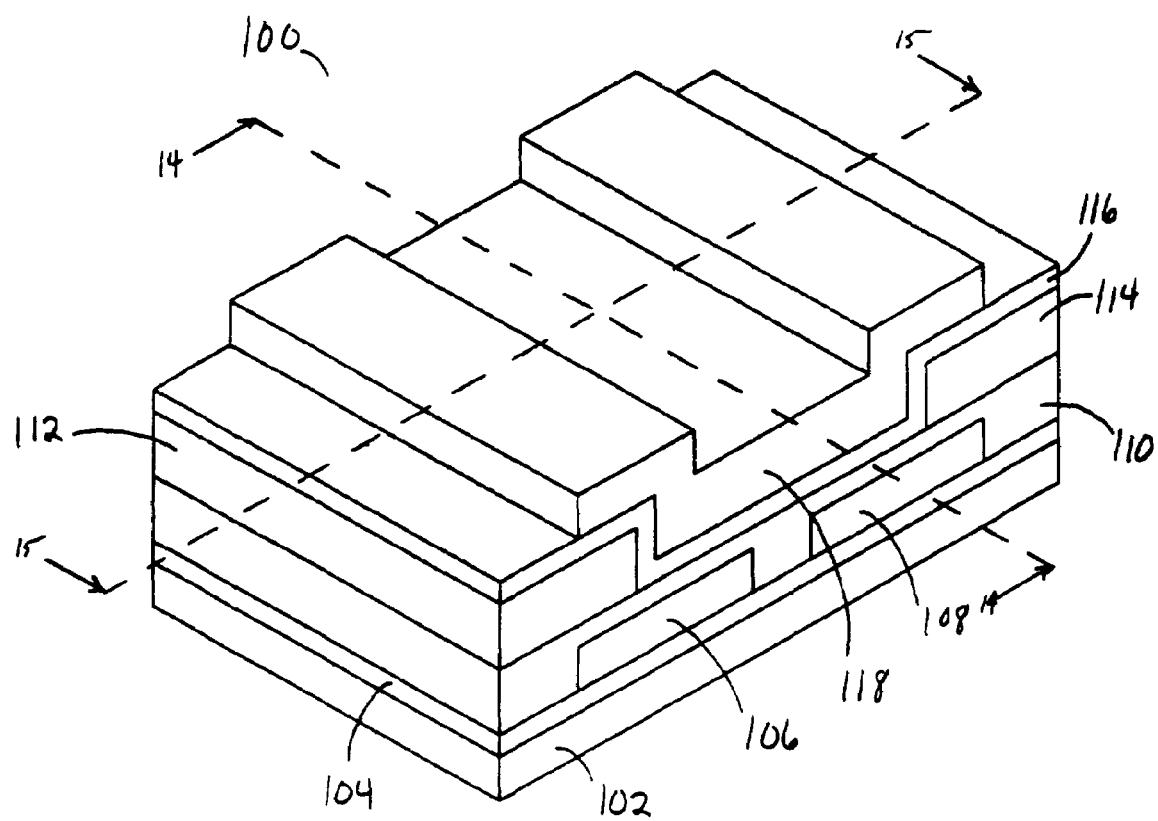
FIG. 13 is a perspective view of a multi-carbon nanotube triple gate transistor.

FIG. 13 illustrates a multi-carbon nanotube triple gate transistor 100. The multi-carbon nanotube quadruple gate transistor 100 includes a silicon substrate 102, a first insulating layer 104, a first local bottom gate 106, a second local bottom gate 108, a second insulating layer 110, a source conductor 112, a drain conductor 114, a third insulating layer 116, and a local top gate 118.

Figure 14:
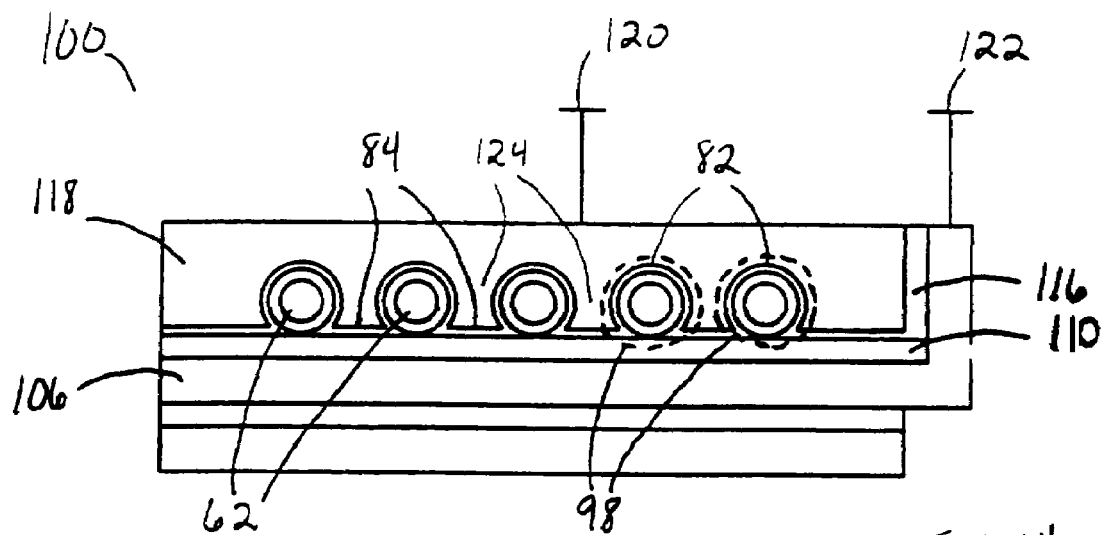
FIG. 14 is a cross sectional side view on 14-14 in FIG. 13 of the multi-carbon nanotube triple gate transistor.

FIG. 14 illustrates the multi-carbon nanotube triple gate transistor 100. The local top gate 118 has been connected to a first electric terminal 120 and the first local bottom gate 106 has been connected to a separate second terminal 122, and similarly, the second local bottom gate is connected to a third electric terminal. The local top gate 118 and the local bottom gates are separated by the second and third insulating layers 110 and 116. The local top gate 118 has formed to match the curved portions 82 and depressions 84 of the third insulating layer 116. The local top gate 118 has lower portions 124 extending downward between the carbon nanotubes 62. The third insulating layer 116 and the local top gate 118 are at a uniform distance to each of the carbon nanotubes

62. The local top gate 118 has formed multi-angle pi-gates 98, or "wraparound" gates, around each of the carbon nanotubes 62. Each pi-gate 98 wraps around approximately 75 percent of its respective carbon nanotube 62.

Figure 15:
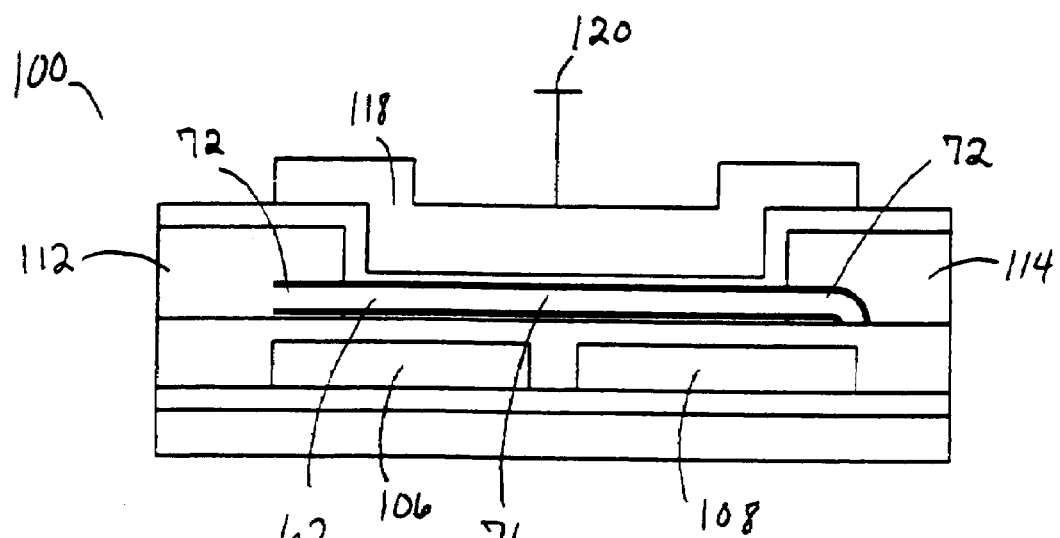
FIG. 15 is a cross sectional side view on 15-15 in FIG. 13 of the multi-carbon nanotube triple gate transistor.

FIG. 15 illustrates the multi-carbon nanotube triple gate transistor 100. The local top gate 118 is connected to the first electric terminal 120. The source conductor 112 has been formed over the source ends 72 of the carbon nanotubes 62 and the drain conductor 114 has been formed over the drain ends 74 of the carbon nanotubes 62. The local top gate 118 lies above the channel portions 76 and the source 72 and drain 74 ends of the carbon nanotubes 62. The first local bottom gate 106 and the second local bottom gate 108 lie beneath the channel portions 76 and the source 72 and drain 74 ends of the carbon nanotubes 62 and are electrically disconnected. The local top gate 118 directly opposes the first local bottom gate 106 and the second local bottom gate 108.

Is use, a primary voltage is applied across the source 112 and drain 114 conductors at all times. The insulating layers separate the source 112 and drain 114 conductors from the local top and bottom gates. Thus, no current conducts through the carbon nanotubes 62 from the source 112 to the drain 114 conductor if no voltage is applied to the local top and bottom gates, and the transistor is "off" because no current conducts from the source conductor 112 to the drain conductor 114 since the carbon nanotubes 62 are not conductive.

When a first voltage is applied to the local top gate 118 the carbon nanotubes 62 act as conductors due to the semiconducting properties of the carbon nanotubes 62. Similarly, when a second voltage is applied to the first local bottom gate 106, portions of the carbon nanotubes 62 above the first local bottom gate 106 act as conductors, and when a third voltage is applied to the second local bottom gate 108, portions of the carbon nanotubes above the second local bottom gate 108 act as conductors. The local bottom gates are connected to different electric terminals so that the portions of the carbon nanotubes 62 between the respective local bottom gates and the local top gate 118 can be controlled separately.

When the first voltage is applied, or both the second and third voltages are applied at the same time, the transistor is "on" because current conducts from the source conductor 112 through the channel to the drain conductor 114 as the source 112 and drain 114 conductors are electrically coupled. The pi-gates 98 formed by the local top gate 118 act as multi-gates around each of the carbon nanotubes 62.

One advantage is that the use of multiple gates increases gate capacitance. The use of the pi-gates around each of the carbon nanotube channels even further increases gate capacitance while utilizing conventional planar fabrication tools. Another advantage is that electron transport and electron mobility through the channel are improved. A further advantage is that different segments of the carbon nanotube can be controlled at different times to improve the performance and realize more functions of the transistor.

Other embodiments of the invention may use different configurations of the carbon nanotubes such as having the carbon nanotubes stacked in a column with the elongate axes still being parallel to each other and the substrate. The pi-gates may surround a different percentage of the carbon nanotubes. If the local top gate includes the pi-gates, a bottom gate may not be needed. Other types of gates not utilizing the pi-gates may be used including double gates, vertical double gates, planar multi-gates, vertical triple gates which may or may not include a bottom gate, and quadruple gates which may include a plurality of local top and bottom gates being electrically disconnected from one another. The quadruple gate embodiment may have the gates arranged in pairs with each gate in a pair opposing the other. A single carbon nanotube may be used as the transistor channel. The insulating layers, or gate dielectric portions, may be made of different materials such as aluminum oxide and tantalum oxide. The semiconducting carbon nanotubes need not be grown but may be positioned on the substrate, and the source and drain conductors may be formed over the respective source and drain ends. Different catalysts may be used to grow the carbon nanotubes such as cobalt, nickel, rhodium platinum, nickel yttrium, or any combination thereof. The source and drain conductors as well as the gates, or gate electrodes, can be made of various materials such as titanium, copper, gold, tungsten, or combination thereof. Alternative techniques can be used to grow the carbon nanotubes including discharge between carbon electrodes, laser vaporation of carbon, thermal decomposition of hydrocarbons such as acetylene, methane, ethane, and plasma enhanced chemical vapor deposition (PECVD).

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method for constructing a semiconductor transistor, comprising:
    forming a local bottom gate electrode on a substrate;
    forming a first insulating layer on the bottom gate electrode;
    depositing an iron catalyst on the first insulating layer;
    growing a semiconducting carbon nanotube from the iron catalyst such that the carbon nanotube is chemically bonded to the iron catalyst and is located on the first insulating layer over the local bottom gate electrode, the semiconducting carbon nanotube having an elongate axis, source and drain ends, and a channel portion between the source and drain ends;
    forming source and drain conductors over the respective source and drain ends of the semiconducting carbon nanotube;
    forming a second insulating layer on the source and drain conductors and the channel portion of the semiconducting carbon nanotube; and
    forming a local top gate electrode over the channel portion of the semiconducting carbon nanotube, the local top gate electrode, in at least one cross-section transverse to the elongate axis of the semiconducting carbon nanotube, being electronically disconnected from the local bottom gate electrode, the local bottom gate electrode and the local top gate electrode being located such that when a voltage is applied to the local top and bottom gate electrodes, the source and drain conductors are electrically coupled through the semiconducting carbon nanotube.

2. The method of claim 1, wherein the first and second insulating layers comprise zirconium oxide.

3. The method of claim 1, wherein an electric field is applied to the semiconducting carbon nanotube as it is being grown.

4. A method for constructing a semiconductor transistor, comprising:
    forming a local bottom gate electrode on a substrate;

forming an insulating layer on the bottom gate electrode;
positioning a semiconducting carbon nanotube on the insulating layer over the local bottom gate electrode, the semiconducting carbon nanotube having an elongate axis, source and drain ends, and a channel portion between the source and drain ends;
forming source and drain conductors over the respective source and drain ends of the semiconducting carbon nanotube;
forming a gate dielectric on the source and drain conductors and the channel portion of the semiconducting carbon nanotube; and
forming a local top gate electrode over the channel portion of the semiconducting carbon nanotube, the local top gate electrode, in at least one cross-section transverse to the elongate axis of the semiconducting carbon nanotube, being electronically disconnected from the local bottom gate electrode, the local bottom gate electrode and the local top gate electrode being located such that when a voltage is applied to the local top and bottom gate electrodes, the source and drain conductors electrically coupled through the semiconducting carbon nanotube, wherein the semiconducting carbon nanotube has a curved outer surface, the gate dielectric being adjacent to the curved outer surface of the semiconducting nanotube, only a portion of the gate dielectric having a curved outer gate dielectric surface.

5. The method of claim 4, wherein the portion of the gate dielectric with the curved outer gate dielectric surface has a substantially uniform thickness.

* * * * *